United States Patent
Krishnan et al.

(10) Patent No.: US 9,816,184 B2
(45) Date of Patent: Nov. 14, 2017

(54) KEYED WAFER CARRIER

(75) Inventors: Sandeep Krishnan, Princeton, NJ (US);
Keng Moy, Basking Ridge, NJ (US);
Alexander I. Gurary, Bridgewater, NJ (US); Matthew King, Montville, NJ (US); Vadim Boguslavskiy, Princeton, NJ (US); Steven Krommenhoek, Annandale, NJ (US)

(73) Assignee: Veeco Instruments Inc., Plainview, NY (US)

( * ) Notice: Subject to any disclaimer, the term of this patent is extended or adjusted under 35 U.S.C. 154(b) by 1111 days.

(21) Appl. No.: 13/424,821

(22) Filed: Mar. 20, 2012

(65) Prior Publication Data

US 2013/0252404 A1    Sep. 26, 2013

(51) Int. Cl.
*C23C 16/458* (2006.01)
*C23C 16/46* (2006.01)
(Continued)

(52) U.S. Cl.
CPC ...... *C23C 16/4584* (2013.01); *C23C 16/4586* (2013.01); *C23C 16/46* (2013.01);
(Continued)

(58) Field of Classification Search
CPC .... H01L 21/67109–21/67115; H01L 21/6719; H01L 21/68764; H01L 21/68771;
(Continued)

(56) References Cited

U.S. PATENT DOCUMENTS 1,795,230 A    3/1931    Ott
1,844,791 A    2/1932    Ott et al.
(Continued)

FOREIGN PATENT DOCUMENTS

CN    202492576 U  * 10/2012
EP    0591086 A2    4/1994
(Continued)

OTHER PUBLICATIONS

International Search Report and Written Opinion for PCT/US2013/028572 dated Jun. 14, 2013.
(Continued)

*Primary Examiner* — Benjamin Kendall
(74) *Attorney, Agent, or Firm* — Lerner, David, Littenberg, Krumholz & Mentlik, LLP

(57) ABSTRACT

A structure for a chemical vapor deposition reactor desirably includes a reaction chamber having an interior, a spindle mounted in the reaction chamber, and a wafer carrier releasably mounted onto the spindle for rotation therewith. The spindle desirably has a shaft extending along a vertical rotational axis and a key projecting outwardly from the shaft. The wafer carrier preferably has a body defining oppositely-facing top and bottom surfaces and at least one wafer-holding feature configured so that a wafer can be held therein with a surface of the wafer exposed at the top surface of the body. The wafer carrier desirably further has a recess extending into the body from the bottom surface of the body and a keyway projecting outwardly from a periphery of the recess along a first transverse axis. The shaft preferably is engaged in the recess and the key preferably is engaged into the keyway.

25 Claims, 6 Drawing Sheets

(51) Int. Cl.
*H01L 21/67* (2006.01)
*H01L 21/687* (2006.01)

(52) U.S. Cl.
CPC .... *H01L 21/6719* (2013.01); *H01L 21/68764* (2013.01); *H01L 21/68771* (2013.01); *H01L 21/68792* (2013.01)

(58) Field of Classification Search
CPC ......... H01L 21/68785; H01L 21/68792; C23C 14/50–14/505; C23C 16/458–16/4586; C23C 16/46; H01J 37/32715–37/32724
See application file for complete search history.

(56) References Cited

U.S. PATENT DOCUMENTS

| | | | |
|---|---|---|---|
| 3,101,573 A | 8/1963 | Thiel | |
| 3,408,982 A | 11/1968 | Capita | |
| 3,418,758 A | 12/1968 | McEwan | |
| 3,731,435 A | 5/1973 | Boettcher et al. | |
| 3,845,738 A | 11/1974 | Berkman et al. | |
| 3,930,341 A | 1/1976 | Neuman | |
| 4,165,584 A | 8/1979 | Scherrer | |
| 4,206,572 A | 6/1980 | Delehonte | |
| 4,512,113 A | 4/1985 | Budinger | |
| 4,551,947 A | 11/1985 | Grimm et al. | |
| 4,679,357 A | 7/1987 | Richter et al. | |
| 4,739,589 A | 4/1988 | Brehm et al. | |
| 4,821,457 A | 4/1989 | Ianuzzi | |
| 4,839,145 A | 6/1989 | Gale et al. | |
| 4,928,434 A | 5/1990 | Gianfranco | |
| 5,077,875 A | 1/1992 | Hoke et al. | |
| 5,088,444 A | 2/1992 | Ohmine et al. | |
| 5,191,738 A | 3/1993 | Nakazato et al. | |
| 5,193,316 A | 3/1993 | Olmstead | |
| 5,226,383 A | 7/1993 | Bhat | |
| 5,335,560 A | 8/1994 | Wang | |
| 5,361,543 A | 11/1994 | Bory | |
| 5,371,978 A | 12/1994 | Higashikawa | |
| 5,377,451 A | 1/1995 | Leoni et al. | |
| 5,402,604 A | 4/1995 | Hashii et al. | |
| 5,422,316 A | 6/1995 | Desai et al. | |
| 5,482,498 A | 1/1996 | Higashikawa | |
| 5,573,448 A | 11/1996 | Nakazima et al. | |
| 5,624,302 A | 4/1997 | Hashii et al. | |
| 5,624,499 A | 4/1997 | Mizuno et al. | |
| 5,647,789 A | 7/1997 | Kitta et al. | |
| 5,674,107 A | 10/1997 | Graebner et al. | |
| 5,683,518 A | 11/1997 | Moore et al. | |
| 5,759,281 A | 6/1998 | Gurary et al. | |
| 5,788,777 A | 8/1998 | Burk, Jr. | |
| 5,840,124 A | 11/1998 | Gurary et al. | |
| D405,430 S | 2/1999 | Matsushima | |
| 5,865,666 A | 2/1999 | Nagahara | |
| 5,920,797 A | 7/1999 | Ballance et al. | |
| 5,954,912 A | 9/1999 | Moore | |
| 5,974,681 A | 11/1999 | Gonzalez-Martin et al. | |
| 6,001,183 A | 12/1999 | Gurary et al. | |
| 6,080,042 A | 6/2000 | McGregor et al. | |
| 6,113,705 A | 9/2000 | Ohashi et al. | |
| 6,125,740 A | 10/2000 | Hedrington et al. | |
| 6,213,478 B1 * | 4/2001 | Nishikawa | 279/4.08 |
| 6,241,825 B1 | 6/2001 | Wytman | |
| 6,375,749 B1 | 4/2002 | Boydston et al. | |
| 6,454,635 B1 | 9/2002 | Zhang et al. | |
| 6,492,625 B1 | 12/2002 | Boguslavskiy et al. | |
| 6,500,059 B2 | 12/2002 | Chang et al. | |
| 6,514,424 B2 | 2/2003 | Wenski et al. | |
| 6,666,948 B2 | 12/2003 | Nguyen | |
| 6,709,981 B2 | 3/2004 | Grabbe et al. | |
| 6,733,367 B1 | 5/2004 | Nguyen | |
| 6,786,807 B2 | 9/2004 | Beckvoort et al. | |
| 6,824,451 B2 | 11/2004 | Hollatz et al. | |
| D503,385 S | 3/2005 | Hosokawa | |
| 6,878,211 B2 * | 4/2005 | Yamaguchi | 118/728 |
| 7,008,308 B2 | 3/2006 | Bjelopavlic et al. | |
| 7,125,313 B2 | 10/2006 | Zelenski et al. | |
| 7,169,234 B2 * | 1/2007 | Weeks et al. | 118/730 |
| 7,235,139 B2 | 6/2007 | Boguslavskiy et al. | |
| 7,252,737 B2 | 8/2007 | Brown et al. | |
| D564,462 S | 3/2008 | Ishii et al. | |
| D574,792 S | 8/2008 | Sato | |
| D579,885 S | 11/2008 | Sato | |
| D586,768 S | 2/2009 | Inoue et al. | |
| 7,520,800 B2 | 4/2009 | Duescher | |
| D601,979 S | 10/2009 | Sato | |
| D616,394 S | 5/2010 | Sato | |
| D616,395 S | 5/2010 | Sato | |
| D633,452 S | 3/2011 | Namiki et al. | |
| 8,021,487 B2 | 9/2011 | Boguslavskiy et al. | |
| 8,177,993 B2 | 5/2012 | Seah et al. | |
| 8,182,315 B2 | 5/2012 | Nguyen | |
| 8,328,600 B2 | 12/2012 | Duescher | |
| D674,759 S | 1/2013 | Chang et al. | |
| D675,567 S | 2/2013 | Hyakutake | |
| 8,448,289 B2 | 5/2013 | Reith et al. | |
| D712,852 S | 9/2014 | Krishnan et al. | |
| D726,133 S | 4/2015 | Krishnan et al. | |
| 2002/0011204 A1 | 1/2002 | Gujer et al. | |
| 2002/0028399 A1 * | 3/2002 | Nakasuji et al. | 430/30 |
| 2002/0106826 A1 | 8/2002 | Boguslavskiy et al. | 438/44 |
| 2003/0057089 A1 | 3/2003 | Nguyen | |
| 2004/0200412 A1 | 10/2004 | Frijlink | |
| 2006/0090915 A1 | 5/2006 | Kim | |
| 2007/0266935 A1 * | 11/2007 | Lee | 118/52 |
| 2009/0194026 A1 | 8/2009 | Burrows et al. | |
| 2009/0224175 A1 * | 9/2009 | Lee | G01N 21/645 250/459.1 |
| 2010/0124610 A1 | 5/2010 | Aikawa et al. | |
| 2010/0212595 A1 * | 8/2010 | Campaneria et al. | 118/728 |
| 2011/0083602 A1 | 4/2011 | Bergmann et al. | |
| 2013/0125820 A1 | 5/2013 | Yin et al. | |
| 2014/0014039 A1 * | 1/2014 | Naito | C23C 16/4584 118/730 |

FOREIGN PATENT DOCUMENTS

| | | |
|---|---|---|
| EP | 0847077 A1 | 6/1998 |
| JP | 59232994 | 12/1984 |
| JP | S61135113 A | 6/1986 |
| JP | 62-145830 | 6/1987 |
| JP | 02-309008 * | 12/1990 |
| JP | H0316122 A | 1/1991 |
| JP | 09-051029 | 2/1997 |
| JP | 09-239635 | 9/1997 |
| JP | H10189469 A | 7/1998 |
| JP | 10-291893 | 11/1998 |
| JP | 02888336 B1 | 5/1999 |
| JP | 2001332486 A | 11/2001 |
| JP | 2004-132868 A | 4/2004 |
| JP | 4159360 | 8/2004 |
| JP | 2011216520 A | 10/2011 |
| JP | 2013-520833 A | 6/2013 |
| KR | 1020030034309 | 5/2003 |
| KR | 2003-0034309 * | 9/2003 |
| KR | 1020110116591 | 10/2011 |
| KR | 0656558 | 8/2012 |
| WO | 9709737 A1 | 3/1997 |
| WO | 9832893 A2 | 7/1998 |
| WO | 02063074 A1 | 8/2002 |
| WO | 2010147053 A1 | 12/2010 |
| WO | 2011006064 A1 | 1/2011 |
| WO | 2012022111 A1 | 2/2012 |

OTHER PUBLICATIONS

Korean Office Action for Application No. 10-2014-7027578 dated Dec. 18, 2014.
Japanese Office Action for Application No. 2015-501689 dated Feb. 27, 2015.

(56) References Cited

OTHER PUBLICATIONS

Extended European Search Report for Application No. EP13763498 dated Jun. 26, 2015.

\* cited by examiner

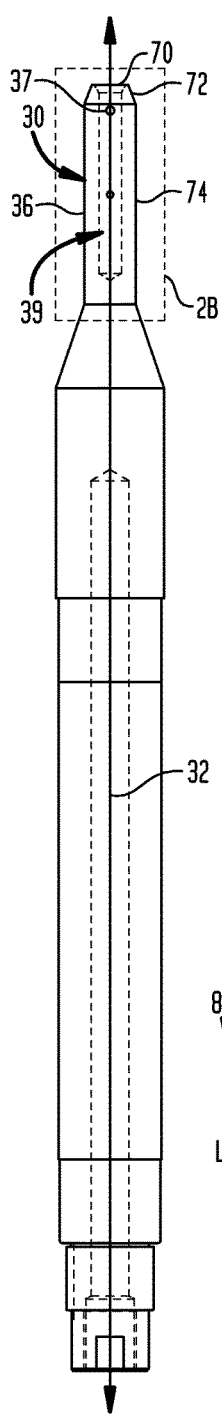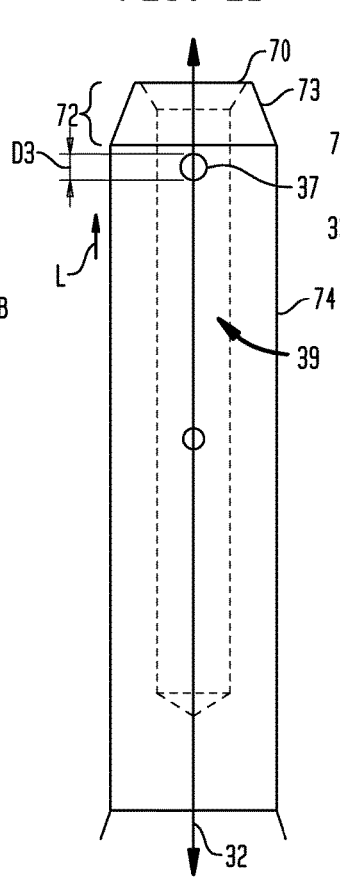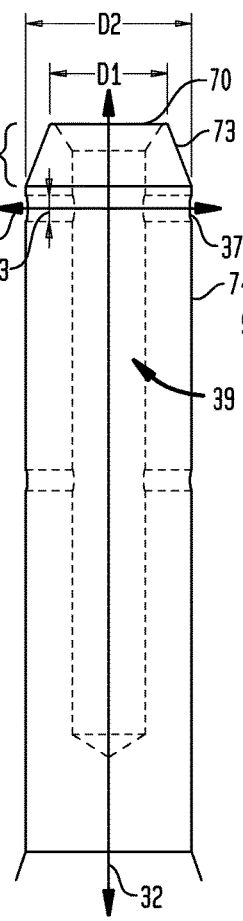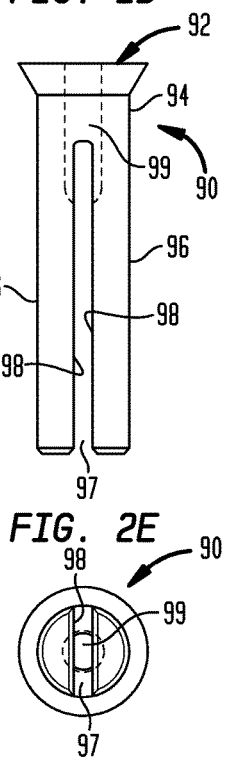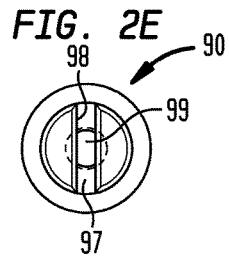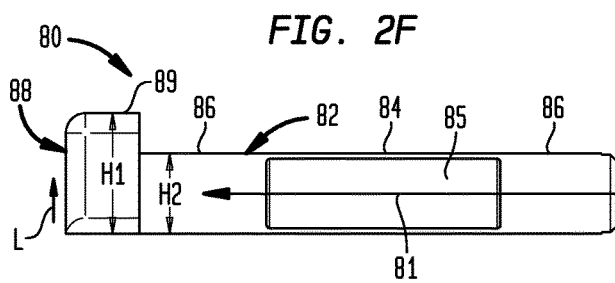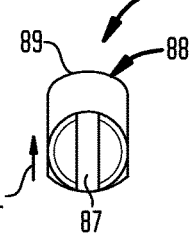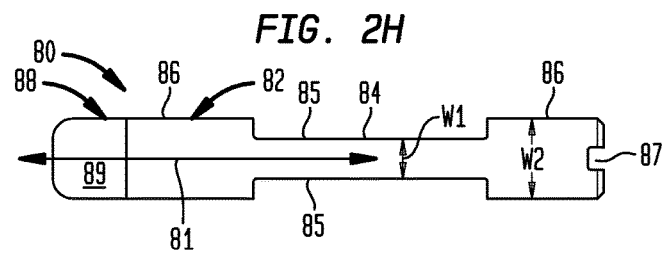

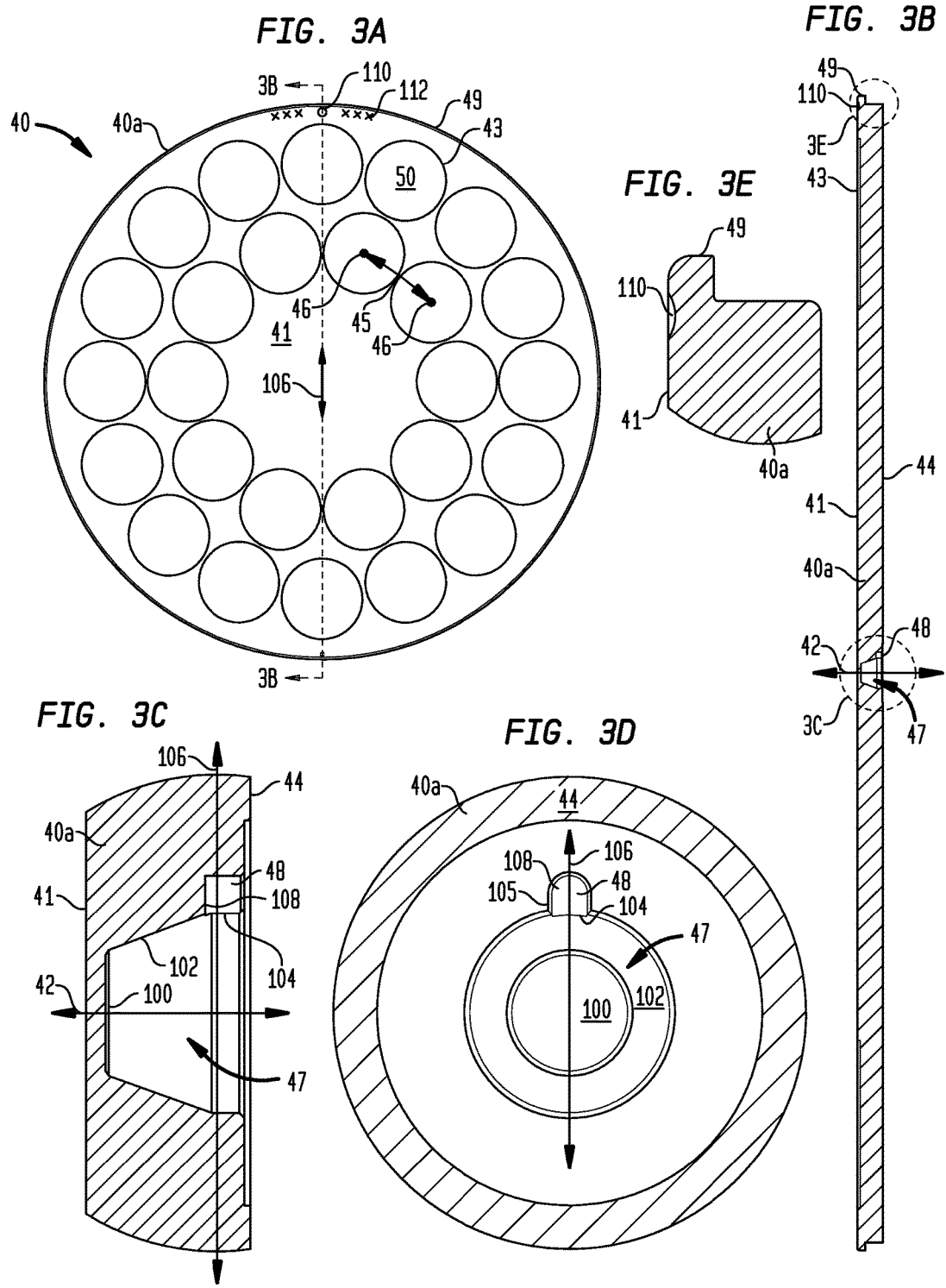

KEYED WAFER CARRIER

BACKGROUND OF THE INVENTION

The present invention relates to wafer processing apparatus, to wafer carriers for use in such processing apparatus, and to methods of wafer processing.

Many semiconductor devices are formed by processes performed on a substrate. The substrate typically is a slab of a crystalline material, commonly referred to as a "wafer." Typically, a wafer is formed by growing a large crystal and slicing the crystal into the shape of a disc. One common process performed on such a wafer is epitaxial growth.

For example, devices formed from compound semiconductors such as III-V semiconductors typically are formed by growing successive layers of the compound semiconductor using metal organic chemical vapor deposition or "MOCVD." In this process, the wafers are exposed to a combination of gases, typically including a metal organic compound as a source of a group III metal, and also including a source of a group V element which flow over the surface of the wafer while the wafer is maintained at an elevated temperature. Typically, the metal organic compound and group V source are combined with a carrier gas which does not participate appreciably in the reaction as, for example, nitrogen. One example of a III-V semiconductor is gallium nitride, which can be formed by reaction of an organo gallium compound and ammonia on a substrate having a suitable crystal lattice spacing, as for example, a sapphire wafer. Typically, the wafer is maintained at a temperature on the order of 500-1100° C. during deposition of gallium nitride and related compounds.

Composite devices can be fabricated by depositing numerous layers in succession on the surface of the wafer under slightly different reaction conditions, as for example, additions of other group III or group V elements to vary the crystal structure and bandgap of the semiconductor. For example, in a gallium nitride based semiconductor, indium, aluminum or both can be used in varying proportion to vary the bandgap of the semiconductor. Also, p-type or n-type dopants can be added to control the conductivity of each layer. After all of the semiconductor layers have been formed and, typically, after appropriate electric contacts have been applied, the wafer is cut into individual devices. Devices such as light-emitting diodes ("LEDs"), lasers, and other electronic and optoelectronic devices can be fabricated in this way.

In a typical chemical vapor deposition process, numerous wafers are held on a component commonly referred to as a wafer carrier so that a top surface of each wafer is exposed at the top surface of the wafer carrier. The wafer carrier is then placed into a reaction chamber and maintained at the desired temperature while the gas mixture flows over the surface of the wafer carrier. It is important to maintain uniform conditions at all points on the top surfaces of the various wafers on the carrier during the process. Minor variations in composition of the reactive gases and in the temperature of the wafer surfaces cause undesired variations in the properties of the resulting semiconductor devices.

For example, if a gallium indium nitride layer is deposited, variations in wafer surface temperature or concentrations of reactive gasses will cause variations in the composition and bandgap of the deposited layer. Because indium has a relatively high vapor pressure, the deposited layer will have a lower proportion of indium and a greater bandgap in those regions of the wafer where the surface temperature is higher. If the deposited layer is an active, light-emitting layer of an LED structure, the emission wavelength of the LEDs formed from the wafer will also vary. Thus, considerable effort has been devoted in the art heretofore towards maintaining uniform conditions.

One type of CVD apparatus which has been widely accepted in the industry uses a wafer carrier in the form of a large disc with numerous wafer-holding regions, each adapted to hold one wafer. The wafer carrier is releasably supported on a spindle within the reaction chamber so that the top surface of the wafer carrier having the exposed surfaces of the wafers faces upwardly toward a gas distribution element. While the spindle is rotated, the gas is directed downwardly onto the top surface of the wafer carrier and flows across the top surface toward the periphery of the wafer carrier. The used gas is evacuated from the reaction chamber through exhaust ports disposed below the wafer carrier and distributed around the axis of the spindle, typically near the periphery of the chamber.

The wafer carrier is maintained at the desired elevated temperature by heating elements, typically electrical resistive heating elements disposed below the bottom surface of the wafer carrier. These heating elements are maintained at a temperature above the desired temperature of the wafer surfaces, whereas the gas distribution element typically is maintained at a temperature well below the desired reaction temperature so as to prevent premature reaction of the gases. Therefore, heat is transferred from the heating elements to the bottom surface of the wafer carrier and flows upwardly through the wafer carrier to the individual wafers.

As described in certain embodiments of U.S. Pat. No. 6,506,252, the spindle may have a tapered contact surface at its top end, and the wafer carrier may have a tapered contact surface within a recess extending into the wafer carrier from the bottom surface of the wafer carrier. The tapered contact surfaces of the spindle and the wafer carrier are configured to have surface contact therebetween when the wafer carrier is assembled onto the spindle. A centroid of the surface contact between the tapered contact surfaces of the spindle and the wafer carrier is typically located above the center of gravity of the wafer carrier, so that the wafer carrier tends to remain seated on the spindle when the spindle is rotated. The wafer carrier can be removed readily from the spindle and replaced by a new wafer carrier bearing new wafers to be treated.

Design of the components of a CVD reactor can be difficult. Such components have to withstand extreme temperature changes, e.g., between room temperature and 1000° C., they have to be replaceable, manufacturable at a reasonable cost, and non-contaminating to the wafers. Also, it has to be relatively easy for robotic equipment to place the wafer carrier onto the spindle. Although considerable effort has been devoted in the art heretofore to optimization of such systems, still further improvement would be desirable.

SUMMARY OF THE INVENTION

Structures for chemical vapor deposition reactors and a method of wafer processing are provided. One aspect of the invention provides a structure for a chemical vapor deposition reactor, the structure comprising a wafer carrier. The wafer carrier desirably includes a body defining oppositely-facing top and bottom surfaces and a vertical rotational axis substantially perpendicular to the top and bottom surfaces, at least one wafer-holding feature, a recess extending into the body from the bottom surface of the body, and a keyway projecting outwardly from a periphery of the recess away from the rotational axis along a first transverse axis. The at least one wafer-holding feature can be configured so that a wafer can be held therein with a surface of the wafer exposed at the top surface of the body.

Another aspect of the invention provides a structure for a chemical vapor deposition reactor, the structure comprising a reaction chamber having an interior and a spindle mounted in the reaction chamber. The spindle preferably has a shaft extending along a vertical rotational axis, the shaft having a top end, a tapered portion extending downwardly from the top end, and a main portion below the tapered portion. The shaft also preferably has a key projecting outwardly from the main portion of the shaft along a first transverse axis transverse to the vertical rotational axis. The tapered portion of the shaft can define a tapered contact surface extending around the rotational axis and can have progressively increasing diameter in the downward direction away from the top end.

Yet another aspect of the invention provides a structure for a chemical vapor deposition reactor, the structure comprising a reaction chamber having an interior, a spindle mounted in the reaction chamber, and a wafer carrier releasably mounted onto the spindle for rotation therewith about a vertical rotational axis. The spindle desirably has a shaft extending along the vertical rotational axis and a key projecting outwardly from the shaft along a first transverse axis transverse to the vertical rotational axis. The wafer carrier desirably has a body defining oppositely-facing top and bottom surfaces and at least one wafer-holding feature configured so that a wafer can be held therein with a surface of the wafer exposed at the top surface of the body. The wafer carrier preferably has a recess extending into the body from the bottom surface of the body and a keyway projecting outwardly from a periphery of the recess along the first transverse axis. The shaft preferably is engaged in the recess and the key preferably is engaged into the keyway.

In a particular embodiment, the key can have a tip portion engaged into the keyway. The tip portion can have an upper surface confronting and spaced apart from a downward-facing surface of the body exposed within the keyway so that the key does not constrain the body against downward movement relative to the shaft. In one example, the shaft can have a top end and a tapered contact surface having progressively increasing diameter in the downward direction away from the top end. In an exemplary embodiment, the shaft can have a main portion below the tapered contact surface and the key can be engaged with the main portion of the shaft. In a particular example, the body of the wafer carrier can have a downward-facing recess end surface and a tapered contact surface within the recess extending downwardly from the recess end surface. The tapered contact surface of the body can be at least partially in contact with the tapered contact surface of the shaft. The recess end surface can be spaced apart from the top end of the spindle.

In one embodiment, a centroid of the surface contact between the tapered contact surfaces of the body and the shaft can be located above the center of gravity of the body. In an exemplary embodiment, the key can be a first key and the keyway can be a first keyway. The spindle can also include one or more second keys each projecting outwardly from the shaft along a respective second transverse axis transverse to the vertical rotational axis. The wafer carrier can also include one or more second keyways each projecting outwardly from a periphery of the recess along a respective one of the second transverse axes. Each second key can be engaged into a corresponding one of the second keyways.

In one example, the spindle can have an aperture extending through the shaft along the first transverse axis and the key can include a shank engaged in the aperture. In an exemplary embodiment, the spindle can also define a recess extending from the top end of the shaft along the vertical rotational axis. The spindle can also include a fork removably engaged in the recess. The fork can have a pair of tines. The shank of the key can be engaged between the tines of the fork. In a particular example, the shank of the key can have a central portion located between the two tines of the fork and end portions adjacent the central portion. The central portion can have a width that is less than a separation distance between the tines of the fork. Each end portion can have a width that is greater than the separation distance, such that the key is interlocked between the two tines and retained by the fork against movement relative to the shaft along the first transverse axis.

In an exemplary embodiment, the central portion of the key can include oppositely-facing substantially planar side surfaces. Each side surface can be disposed adjacent a surface of one of the tines, such that the key is rotationally fixed by the fork against rotation about the first transverse axis. In a particular embodiment, the key and the fork can each consist essentially of a first material, and the shaft can consist essentially of a second material different than the first material. In one embodiment, the fork can include a threaded aperture and the threaded aperture can be exposed at the top end of the shaft. In a particular example, the key can have a tip portion disposed outside of the shaft. The tip portion can have a height in a longitudinal direction parallel to the vertical rotational axis that is greater than a diameter of the aperture. In an exemplary embodiment, the tip portion of the key can have a rounded upper surface that faces toward the top end of the shaft. In one embodiment, the key can be a first key, and the spindle can also include one or more second keys. Each second key can project outwardly from the shaft along a respective transverse axis transverse to the vertical rotational axis.

In a particular example, the at least one wafer-holding feature of the wafer carrier can include a plurality of pockets defined in the top surface of the body. Each pocket can be configured so that a wafer can be held therein. Each said pocket can have a center. In one embodiment, at least some of the pockets can be disposed adjacent the rotational axis and can be arranged in a circular pattern distributed around the rotational axis with spaces between centers of adjacent pockets in the pattern. The keyway can be aligned with one said space. In an exemplary embodiment, the at least some of the pockets that are arranged in the circular pattern can be distributed symmetrically around the vertical rotational axis.

In a particular embodiment, the body of the wafer carrier can have reference indicia defined in at least one of the top surface, the bottom surface, or a peripheral surface extending between the top and bottom surfaces of the body. The reference indicia can be visible to an imaging device. The indicia can be disposed at a predetermined location relative to the keyway in a circumferential direction around the rotational axis. In one embodiment, a plane parallel to the bottom surface of the wafer carrier and containing the first transverse axis can extend through the reference indicia.

In an exemplary embodiment, the structure can also include an encoder connected to the spindle and arranged to provide a signal representing the rotational orientation of the spindle, an automated vision system adapted to detect the rotational location of the reference indicia, and a robotic control system arranged to rotate at least one of the wafer carrier and the spindle to align the rotational locations of the key and the keyway to one another. In a particular example, the wafer carrier can be substantially disc-shaped. In an exemplary embodiment, the keyway can be a first keyway, and the wafer carrier can also include one or more second keyways. Each second keyway can project outwardly from the periphery of the recess along a respective transverse axis transverse to the vertical rotational axis.

In one example, the reaction chamber can have a location element at a wall or a base plate of the reaction chamber. The location element can have a known relationship with a coordinate system fixed to the reaction chamber. The structure can also include a homing tool adapted to be removably coupled to the spindle and the location element. In a particular embodiment, the homing tool can have a slot adapted to receive the key therein. In an exemplary embodiment, the spindle can have reference indicia defined in at least one of the shaft or the key. The indicia can be disposed at a predetermined location relative to the key in a circumferential direction around the rotational axis. The structure can also include a noncontact vision system adapted to detect the rotational location of the reference indicia, the vision system having a known relationship with a coordinate system fixed to the reaction chamber.

Still another aspect of the invention provides a method of wafer processing. The method desirably includes the steps of placing at least one wafer on a wafer carrier, releasably mounting the wafer carrier onto a spindle located in a reaction chamber for rotation therewith about a vertical rotational axis, and, while the wafer carrier is mounted onto the spindle, rotating the spindle and the wafer carrier about the rotational axis and treating a top surface of each of the at least one wafer. The wafer carrier desirably defines oppositely-facing top and bottom surfaces, and the vertical rotational axis desirably is substantially perpendicular to the top and bottom surfaces. The step of releasably mounting the wafer carrier onto the spindle preferably is performed such that a shaft of the spindle engages into a recess extending into the wafer carrier from the bottom surface of the wafer carrier, and such that a key projecting outwardly from a periphery of the shaft away from the rotational axis along a first transverse axis releasably engages into a keyway projecting outwardly from a periphery of the recess away from the rotational axis along the first transverse axis.

In one example, the method can also include the steps of detecting a rotational orientation of the spindle, detecting a rotational orientation of the wafer carrier, and automatically aligning the key and the keyway prior to mounting the wafer carrier onto the spindle. In a particular embodiment, the step of detecting the rotational orientation of the wafer carrier can include detecting a position of at least one reference indicia on the wafer carrier using an automated vision system. In an exemplary embodiment, the step of detecting the rotational orientation of the spindle can be performed using a rotary encoder connected to the spindle.

In a particular embodiment, the method can also include the steps of detecting the rotational orientation of the spindle and assigning the rotational orientation of the spindle to be a home position that has a known relationship with a coordinate system fixed to the reaction chamber. In one example, the method can also include, before the detecting and assigning steps, removably coupling a homing tool to the spindle, rotating the homing tool, and removably coupling the homing tool to a location element at a wall or a base plate of the reaction chamber. The location element can have a known relationship with the coordinate system fixed to the reaction chamber. In an exemplary embodiment, the step of detecting the rotational orientation of the spindle can include rotating the spindle and detecting a position of at least one reference indicia on the spindle using a noncontact vision system. The vision system can have a known relationship with the coordinate system fixed to the reaction chamber.

BRIEF DESCRIPTION OF THE DRAWINGS

FIG. 2A is a side view of the spindle shown in FIG. 1.

FIG. 2B is an enlarged fragmentary side view of portion 2B of the spindle shown in FIG. 2A.

FIG. 2C is another enlarged fragmentary side view of portion 2B of the spindle shown in FIG. 2A.

FIG. 2D is a fork that is configured to be removably engaged in a recess of the spindle of FIG. 2A.

FIG. 2E is a bottom plan view of the fork shown in FIG. 2D.

FIG. 2F is a side view of a key configured to be removably engaged in the spindle of FIG. 2A and in the fork of FIG. 2D.

FIG. 2G is an end view of the key shown in FIG. 2F.

FIG. 2H is a side view of the key shown in FIG. 2F.

FIG. 3A is a top plan view of the wafer carrier shown in FIG. 1.

FIG. 3B is a side cross-sectional view of the wafer carrier shown in FIG. 3A, taken along the line 3B-3B of FIG. 3A.

FIG. 3C is an enlarged fragmentary side cross-sectional view of the recess shown in FIG. 3B.

FIG. 3D is an enlarged fragmentary bottom plan view of the recess shown in FIG. 3C.

FIG. 3E is an enlarged fragmentary side cross-sectional view of a portion of the wafer carrier having reference indicia.

DETAILED DESCRIPTION

Figure 1:
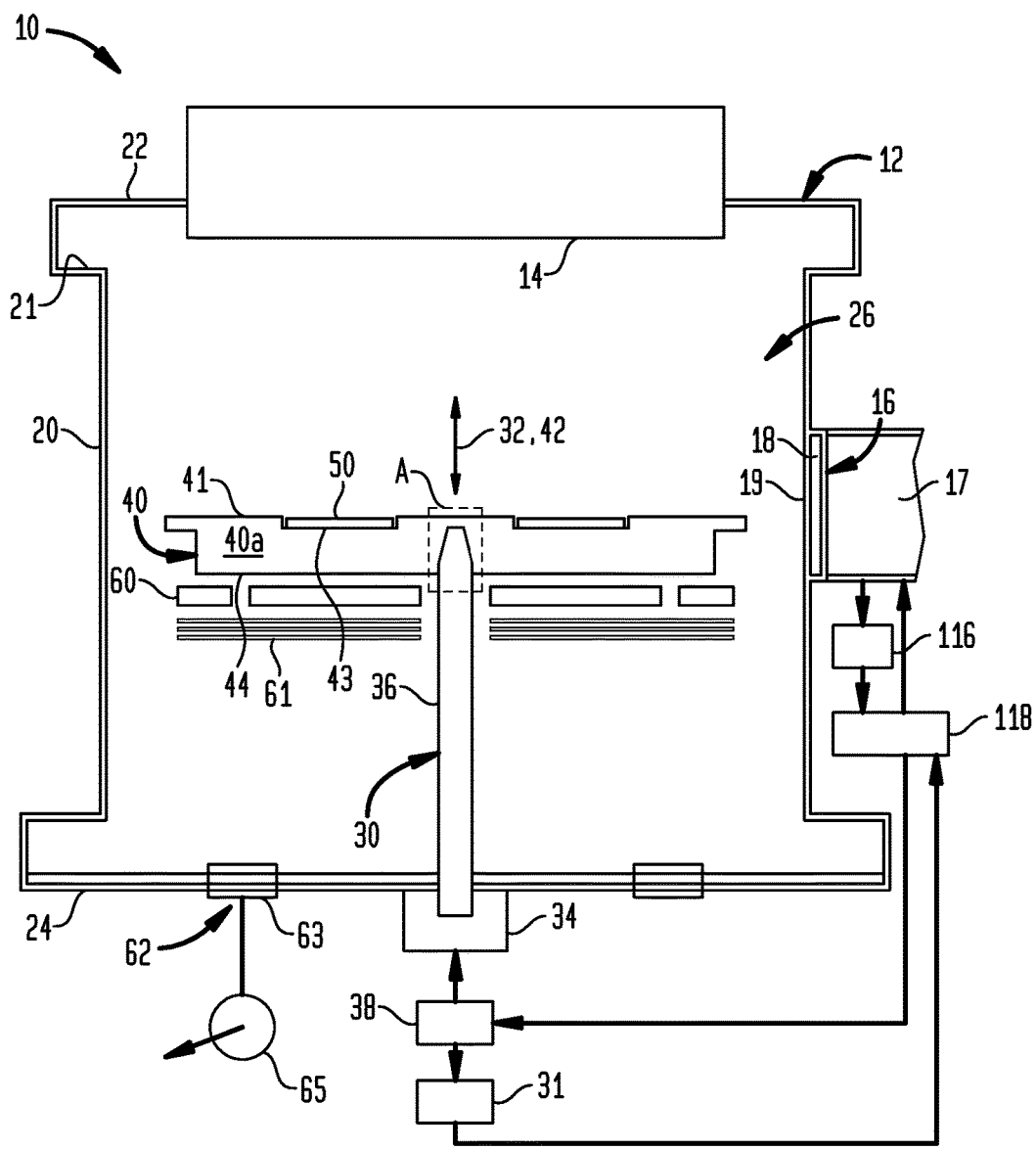
FIG. 1 is a perspective cross-sectional view depicting a chemical vapor deposition apparatus in accordance with one embodiment of the invention.

Referring to FIG. 1, the chemical vapor deposition apparatus 10 in accordance with one embodiment of the invention includes a reaction chamber 12 having a gas inlet manifold 14 arranged at one end of the chamber 12. The end of the chamber 12 having the gas inlet manifold 14 is referred to herein as the "top" end of the chamber 12. This end of the chamber typically, but not necessarily, is disposed at the top of the chamber in the normal gravitational frame of reference. Thus, the downward direction as used herein refers to the direction away from the gas inlet manifold 14; whereas the upward direction refers to the direction within the chamber, toward the gas inlet manifold 14, regardless of whether these directions are aligned with the gravitational upward and downward directions. Similarly, the "top" and "bottom" surfaces of elements are described herein with reference to the frame of reference of chamber 12 and manifold 14.

The chamber 12 has a cylindrical wall 20 that extends between a top flange 22 at the top end of the chamber and a base plate 24 at the bottom end of the chamber. The wall 20, the flange 22, and the base plate 24 define an air-tight sealed interior region 26 therebetween that can contain gasses emitted from the gas inlet manifold 14. Although the chamber 12 is shown as cylindrical, other embodiments can include a chamber having another shape, including, for example, a cone or other surface of revolution about a central axis 32, a square, a hexagon, an octagon, or any other appropriate shape.

The gas inlet manifold 14 is connected to sources for supplying process gases to be used in the wafer treatment process, such as a carrier gas and reactant gases such as a metalorganic compound and a source of a group V element. In a typical chemical vapor deposition process, the carrier gas can be nitrogen, hydrogen, or a mixture of nitrogen and hydrogen, and hence the process gas at the top surface of a wafer carrier can be predominantly composed of nitrogen and/or hydrogen with some amount of the reactive gas components. The gas inlet manifold 14 is arranged to receive the various gases and direct a flow of process gasses generally in the downward direction.

The gas inlet manifold 14 can also be connected to a coolant system (not shown) arranged to circulate a liquid through the gas distribution element so as to maintain the temperature of the element at a desired temperature during operation. A similar coolant arrangement (not shown) can be provided for cooling the walls of the chamber 12.

The chamber 12 can also be provided with an entry opening 16 leading to an antechamber 17 and/or other intermediate wafer carrier transfer chambers, and a moveable shutter 18 for closing and opening the entry opening 16. The shutter 18 can be configured as disclosed, for example, in U.S. Pat. No. 7,276,124, the disclosure of which is hereby incorporated by reference herein. The shutter 18 desirably is in the form of a circular hoop extending around the circumference of the chamber 12. The shutter 18 may have an interior surface 19 that defines the interior surface of the chamber 12.

A spindle 30 is arranged within the chamber for rotation about a vertical rotational axis 32. The vertical rotational axis 32 of the spindle 30 extends in the upward and downward directions of the reaction chamber 12. The spindle is mounted to the chamber 12 by a conventional rotary pass-through device 34 incorporating bearings and seals (not shown) so that the spindle can rotate about the vertical rotational axis 32, while maintaining a seal between the spindle 30 and the base plate 24 of the chamber 12.

Referring to FIGS. 2A-2C, the spindle 30 has a shaft 36 extending along the vertical rotational axis 32. The shaft has a top end 70 closest to the gas inlet manifold 14, a tapered portion 72 extending downwardly from the top end, and a main portion 74 below the tapered portion. The tapered portion 72 of the shaft 36 extends around the rotational axis 32 and defines a tapered contact surface 73 extending around the rotational axis and having progressively increasing diameter in the downward direction away from the top end 70. For example, the tapered contact surface 73 can have a first diameter D1 at the top end 70 of the shaft 36 that increases in the downward direction to a second diameter D2 at the main portion 74 that is greater than the first diameter D1.

The spindle 30 can have an aperture 37 extending through the shaft 36 along a first transverse axis 33 (FIG. 2C) that is transverse (i.e., crosswise) to a plane containing the vertical rotational axis 32. As used herein, a first axis that is "transverse" to a plane containing a second axis means that the first axis intersects the plane at any non-zero angle, which may be oblique or perpendicular. In the embodiment shown in the figures, the first transverse axis 33 is perpendicular to the vertical rotational axis 32, but that need not be the case. In a particular embodiment, the aperture 37 can extend through the shaft 36 at an oblique angle, such that the first transverse axis 33 does not intersect the vertical rotational axis 32.

The aperture 37 can be configured to receive a key 80 (FIGS. 2F-2H) extending therethrough and projecting outwardly from the main portion 74 of the shaft 36 along the first transverse axis 33. In the figures, the aperture 37 extends through the main portion 74 of the shaft 36, but that need not be the case. In an alternative embodiment (not shown), the aperture 37 can extend through the tapered portion of the shaft 36, or the aperture can extend through a location where the tapered and main portions of the shaft meet. In some embodiments, e.g., FIGS. 8A and 8B, a spindle can be provided with or configured to receive one or more keys that do not extend therethrough, as will be described in more detail below.

The key 80 includes a shank 82 that is configured to be engaged in the aperture 37 of the spindle 30. The shank 82 is elongated in a direction of a shank axis 81. The shank 82 has a central portion 84 and end portions 86 adjacent the central portion. The central portion 84 can include oppositely-facing substantially planar side surfaces 85, such that the central portion has a width W1 that is less than a width W2 of the end portions 86. The end portions 86 can each have a circular cross-section. One of the end portions 86 can define a slotted recess 87 therein that is configured to receive the tip of a screwdriver during assembly as discussed below.

The key 80 can have a tip portion 88 adjacent the shank 82, the tip portion having a height H1 in a longitudinal direction L transverse to the shank axis 81 that is greater than a diameter D1 of the aperture 37 in the shaft 36. As shown in the figures, the height H1 of the tip portion 88 can be greater than a height H2 of the shank 82. In an alternative embodiment (not shown), the height H1 of the tip portion 88 can be equal to or less than the height H2 of the shank 82. In one example, the tip portion 88 of the key 80 can have an upper surface 89 that is rounded as seen in end view looking along the shank axis 81 (FIG. 2G).

The spindle 30 spindle can further define a recess 39 extending downward from the top end 70 of the shaft 36 along the vertical rotational axis 32. The recess 39 can be configured to receive a fork 90 (FIGS. 2D and 2E) extending therein along the vertical rotational axis 32.

The fork 90 includes a top end 92, an upper portion 94 extending downwardly from the top end, and a pair of tines 94 below the upper portion. The fork 90 can be configured to be removably engaged within the recess 39. The upper portion of the fork can have a circular cross-section, and the tines 96 can each have a cross-section that is a portion of a circle, with a gap 97 defined between the tines. Each of the tines 96 can have a substantially planar side surface 98 facing inward to the gap 97. The fork 90 can include a threaded aperture 99 that is exposed at the top end of the shaft 36, so that the fork can be removed from the recess 39 by a user by threading a bolt into the threaded aperture and pulling the bolt to withdraw the fork.

Figure 4:
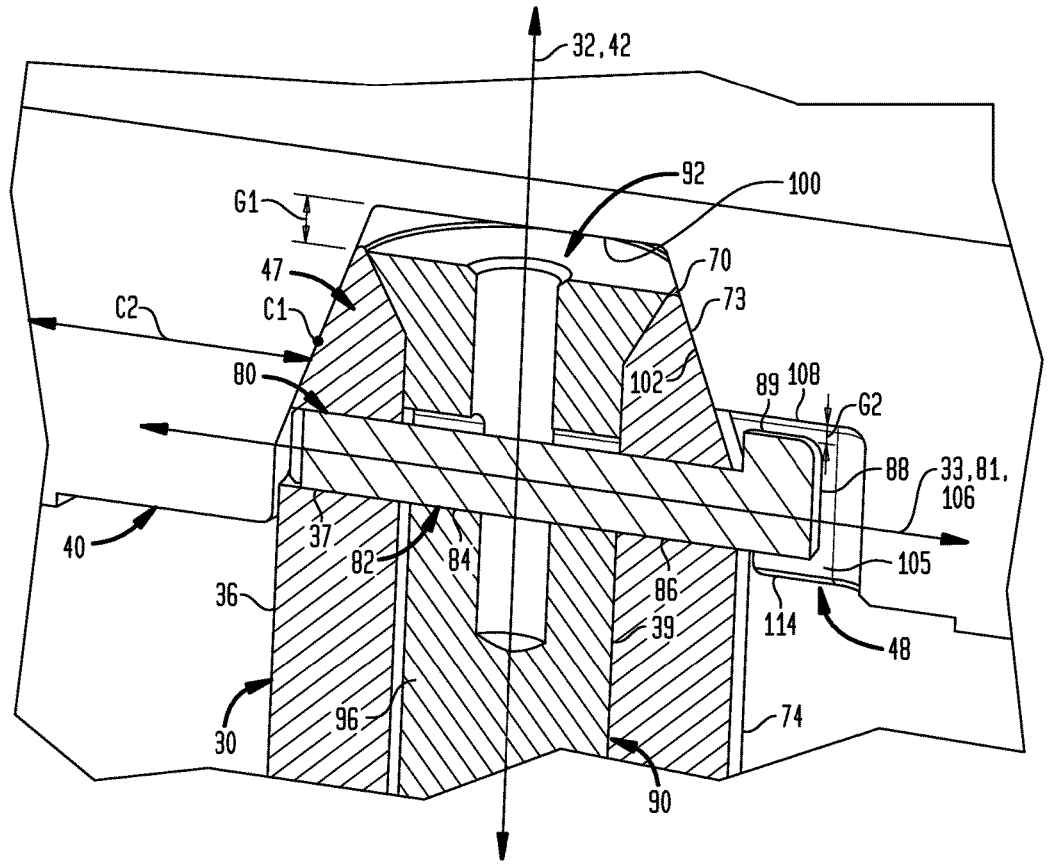
FIG. 4 is an enlarged fragmentary perspective cross-sectional view of portion A of the chemical vapor deposition apparatus shown in FIG. 1.

Referring to FIG. 4, the key 80 and the fork 90 can be assembled with the shaft 36 before a wafer carrier 40 is mounted onto the spindle 30. To assemble the key 80 with the shaft 36, the shank 82 of the key can be engaged in the aperture 37 of the shaft, such that the tip portion 88 of the key is disposed outside of the shaft and projects outwardly from the shaft along the first transverse axis 33. In the embodiment shown in the figures, the shank axis 81 is coincident with the first transverse axis 33 when the key 80 is engaged in the shaft 36. As shown in FIG. 4, the aperture 37 extends through the main portion 74 of the shaft 36, such that the key 80 is engaged with the main portion of the shaft.

Before the fork 90 is engaged in the recess 39, the substantially planar side surfaces 85 of the key 80 should be oriented parallel to the vertical rotational axis 32 of the shaft 36. A user can rotate the key 80 to the desired orientation by inserting the tip of a screwdriver in the slotted recess 87 and rotating the screwdriver about the shank axis 81.

To assemble the fork 90 with the shaft 36 and the key 80, the fork 90 can be engaged in the recess 39 of the spindle 30, such that the top end 92 of the fork is located at the top end 70 of the shaft 36. The fork 90 can be lowered into the recess 39 so that the shank 82 of the key 80 is engaged between the tines 96 of the fork 90. Each side surface 85 of the central portion 84 of the key 80 is disposed adjacent a substantially planar side surface 98 of one of the tines 96, such that the key is rotationally fixed by the fork 90 against rotation about the first transverse axis 33.

The central portion 84 of the shank 82 has a width W1 (FIG. 2H) that is less than the separation distance or gap 97 (FIG. 2D) between the tines 96 of the fork 90, and each end portion 86 of the shank has a width W2 (FIG. 2H) that is greater than the separation distance between the tines of the fork, such that the key is interlocked between the two tines and retained by the fork against movement relative to the shaft 36 along the first transverse axis 33.

In a particular embodiment, the key 80 and the fork 90 can each consist essentially of a first material, and the shaft 36 can consist essentially of a second material different than the first material. For example, the key 80 and the fork 90 can be made of a tungsten alloy such as WL, and the shaft 36 can be made of a molybdenum alloy such as TZM. Such a combination of materials among the key 80, the fork 90, and the shaft 36 can prevent bonding between the shaft and the key and/or the fork during operation of the apparatus 10 at high temperatures.

Referring again to FIG. 1, the spindle 30 is connected to a rotary drive mechanism 38 such as an electric motor drive, which is arranged to rotate the spindle about the central axis 32. The spindle 30 can also be provided with internal coolant passages extending generally in the axial directions of the spindle within the gas passageway. The internal coolant passages can be connected to a coolant source, so that a fluid coolant can be circulated by the source through the coolant passages and back to the coolant source.

The spindle 30 and/or the rotary drive mechanism 38 can be connected to an encoder 31 that is arranged to provide a signal representing the rotational orientation of the spindle about the rotational axis 32. In a particular embodiment, the encoder 31 can be a high resolution rotary encoder that is coupled to the rotary drive mechanism 38. Such rotational orientation information about the spindle 30 can be used to determine the rotational orientation of the wafer carrier 40 if there is a known relationship between the rotational orientation of the spindle and the wafer carrier, such as can be achieved in the apparatus 10.

A wafer carrier 40 can be substantially in the form of a disc-like body 40a having flat, circular top and bottom surfaces 41, 44 and a vertical rotational axis 42 that is substantially perpendicular to the top and bottom surfaces. In the operative position shown in FIG. 1, the wafer carrier is mounted on the spindle 30, such that the vertical rotational axis 42 of the wafer carrier is coincident with the vertical rotational axis 32 of the spindle. The wafer carrier is located below the gas inlet manifold 14 within the chamber 12, such that the gas inlet manifold can discharge gas downwardly toward the wafer carrier while the wafer carrier rotates. When the shutter 18 is in the operating position shown in FIG. 1, the interior surface 19 of the shutter surrounds the wafer carrier 40.

The wafer carrier 40 can be formed as a single piece or as a composite of plural pieces. For example, as disclosed in U.S. Published Patent Application No. 20090155028, the disclosure of which is hereby incorporated by reference herein, the wafer carrier 40 may include a hub defining a small region of the wafer carrier surrounding the central axis 42 and a larger portion defining the remainder of the disc-like body 40a.

The wafer carrier 40 can be formed from materials that do not contaminate the CVD process and that can withstand the temperatures encountered in the process. For example, the larger portion of the wafer carrier 40 may be formed largely or entirely from materials such as graphite, silicon carbide, boron nitride, aluminum nitride, or other refractory materials. The wafer carrier 40 has generally planar upper and lower surfaces extending generally parallel to one another and generally perpendicular to the vertical rotational axis 42 of the wafer carrier. In one example, the wafer carrier 40 can be about 300 mm to about 700 mm in diameter.

Referring to FIGS. 3A-3E, the top surface 41 of the wafer carrier 40 can include at least one wafer-holding feature, such wafer-holding feature shown in the form of pockets 43. The pockets 43 can be arranged circumferentially about the wafer carrier 40, each such pocket being configured to removably receive a disc-like wafer 50 and to hold such wafer therein during a MOCVD process such as that described below. In one example, at least some of the pockets 43 can be disposed adjacent the vertical rotational axis 42 and can be arranged in a circular pattern distributed around the vertical rotational axis with spaces 45 between centers 46 of adjacent pockets in the pattern, such as when the pockets are arranged in a configuration having one or more concentric rings. In a particular embodiment, the pockets 43 that are arranged in the circular pattern distributed around the vertical rotational axis 42 can be distributed symmetrically around the vertical rotational axis. Although the pockets 43 are shown in the figures as arranged in a circular pattern, in other embodiments, the pockets can be arranged in other patterns, such as a portion of a rectangular array or a hexagonal close-packed configuration.

Each wafer 50 can be formed from a sapphire, silicon carbide, silicon, or other crystalline substrate. Typically, each wafer 50 has a thickness which is small in comparison to the dimensions of its major surfaces. For example, a circular wafer 50 about 2 inches (50 mm) in diameter may be about 430 µm thick or less. Each wafer 50 can disposed on or adjacent the wafer carrier 40 with a top surface thereof facing upwardly, so that the top surface of the wafer is exposed at the top surface 41 of the wafer carrier body 40a. The wafers 50 can be coplanar or nearly coplanar with the top surface 41 of the wafer carrier 40.

The wafer carrier 40 can have a recess 47 extending into the body 40a from the bottom surface 44 of the body. The body 40a can have a downward-facing recess end surface 100 and a tapered contact surface 102 extending downwardly from the recess end surface. The recess end surface 100 and the tapered contact surface 102 can be exposed within the recess 47.

The recess 47 can have a keyway 48 projecting outwardly from a periphery 104 of the recess away from the rotational axis 42 along a first transverse axis 106 that is transverse to a plane containing the vertical rotational axis 42 (i.e., the first transverse axis intersects a plane containing the vertical rotational axis at any non-zero angle, which may be oblique or perpendicular). As shown in FIG. 3C, the first transverse axis 106 can intersect the vertical rotational axis 42, but that need not be the case. In a particular embodiment, the keyway 48 can project outwardly from the periphery 104 of the recess 48 at an oblique angle, such that the first transverse axis 106 does not intersect the vertical rotational axis 42. As used herein, when the keyway 48 is described as projecting along the first transverse axis 106, that means that first transverse axis lies in a plane parallel to the bottom surface 44 of the wafer carrier 40, and that the first transverse axis is located equidistant from opposing lateral key contact surfaces 105 of the keyway that extend between the insertion edge 114 and the downward-facing surface 108.

The body 40a can have a downward-facing surface 108 exposed within the keyway 48. In one example, the keyway 48 can be aligned with one of the spaces 45 between centers 46 of adjacent pockets 43, when such adjacent pockets are disposed adjacent the vertical rotational axis 42 and are arranged in a circular pattern distributed around the vertical rotational axis.

In such an embodiment, the alignment of the keyway with one of the spaces 45 can minimize the change in thermal characteristics of heat conduction through the wafer carrier 40 near the keyway. This effect is sometimes referred to as the "thermal shadow" of the keyway. By aligning the keyway 48 with one of the spaces 45, the thermal shadow can be as far as possible from the pockets 43.

In the embodiment shown in the figures, the first transverse axis 106 is perpendicular to the vertical rotational axis 42, but that need not be the case. In the operative position shown in FIG. 4, the wafer carrier 40 is mounted on the spindle 30, such that the first transverse axis 106 of the wafer carrier is coincident with the first transverse axis 33 of the spindle.

The body 40a of the wafer carrier 40 can have reference indicia in the form of a dimple 110 and/or one or more markings 112 extending into the body 40a from the top surface 41 of the body. Reference indicia such as one or more dimples 110 and/or markings 112 can be defined in at least one of the top surface 41, the bottom surface 44, or a peripheral surface 49 extending between the top and bottom surfaces of the body 40a. In one embodiment, the reference indicia can be visible to an imaging device, such as the automated vision system 116 described below.

The dimple 110 and/or markings 112 can be disposed at a predetermined location relative to the keyway 48 in a circumferential direction around the vertical rotational axis 42. For example, a plane parallel to the bottom surface 44 and containing the first transverse axis 106 can also extend through the reference indicia such as the dimple 110 and/or markings 112, such that the first transverse axis can extend through the reference indicia, or the first transverse axis can extend through a location directly above or below the reference indicia. The dimple 110 and/or markings 112 can be disposed at any location relative to the keyway 48 that is known, for example by a user or the control system 118 described below, such that the location of the keyway can be determined by observing the location of the dimple and/or markings.

Referring to FIG. 4, the wafer carrier 40 can be releasably mounted onto the spindle 30 for rotation therewith about the vertical rotational axis 32, 42. In the embodiment shown in the figures, the vertical rotational axes 32 and 42 are coincident and the first transverse axes 33 and 106 are coincident when the wafer carrier 40 is mounted onto the spindle 30.

The top end 70 of the spindle 30 can be engaged in the recess 47 of the wafer carrier 40, such that the tapered contact surface 102 of the body 40a is at least partially in contact with the tapered contact surface 73 of the shaft 36, and such that the recess end surface 100 is spaced apart from the top end of the spindle. The recess end surface 100 can be spaced apart from the top end 70 of the spindle by a gap G1. As shown in FIG. 4, a centroid C1 of surface contact between the tapered contact surfaces 102, 73 of the body 40a and the shaft 36 is located above the center of gravity C2 of the body.

The tip portion 88 of the key 80 can be engaged in the keyway 48, such that the downward-facing surface 108 of the body 40a exposed within the keyway confronts and is spaced apart from the upper surface 89 of the tip portion. As shown in FIG. 4, the surface 108 of the body 40a is spaced apart from the upper surface 89 of the tip portion 88 of the key 80 by a gap G2. Such a gap G2 between the surfaces 108 and 89 can allow the key 80 to constrain the rotational motion of the wafer carrier 40 relative to the spindle 30, while not constraining the body 40a of the wafer carrier against downward movement relative to the shaft 36 of the spindle. In a particular example, the upper surface 89 of the tip portion 88 of the key 80 can have chamfered edges, and/or an insertion edge 114 of the keyway 48 can be chamfered to allow for some self-alignment of the key 80 into the keyway if the wafer carrier 40 is not perfectly rotationally aligned with the spindle 30 when the wafer carrier is mounted onto the spindle (e.g., if the first transverse axes 106 and 33 are not perfectly coincident).

Referring again to FIG. 1, for many processes such as MOCVD, the wafer carrier 40 is heated to provide the desired temperature at the surfaces of the wafers 50. For such heating, a heating element 60 is mounted within the chamber 12 and surrounds the spindle 30 below the top end 70 of the shaft 36. The heating element 60 can transfer heat to the bottom surface 44 of the wafer carrier 40, principally by radiant heat transfer. Heat applied to the bottom surface of the wafer carrier 40 can flow upwardly through the body 40a of the wafer carrier to the top surface 41 thereof. Heat can pass upwardly to the bottom surface of each wafer 50 held by the wafer carrier 40, and upwardly through the wafers and to the top surfaces thereof. Heat can be radiated from the top surfaces of the wafers 50 to the colder elements of the process chamber 12 as, for example, to the walls 20 of the process chamber and to the gas inlet manifold 14. Heat can also be transferred from the top surfaces of the wafers 50 to the process gas passing over these surfaces.

In a particular embodiment, the heating element 60 can be a multi-zone heating element, whereby different portions of the wafer carrier 40 (e.g., a first annular portion located at a first radial distance from the vertical rotational axis 32 of the spindle 30, and a second annular portion located at a second radial distance from the vertical rotational axis) can be heated differently.

The chamber 12 can also include an outer liner (not shown) that reduces process gas penetration into the area of the chamber containing the heating element 60. In an example embodiment, heat shields 61 can be provided below the heating element 60, for example, disposed parallel to the wafer carrier 40, to help direct heat from the heating element upwards towards the wafer carrier and not downwards towards the base plate 24 at the bottom end of the chamber 12.

The chamber 12 is also equipped with an exhaust system 62 arranged to remove spent gases from the interior region 26 of the chamber. The exhaust system 62 can be connected to the chamber 12 at a location below the location occupied by the wafer carrier 40. The exhaust system 62 can include an exhaust manifold 63 at or near the bottom of the chamber 12. The exhaust manifold 63 can be connected to a pump 65 or other vacuum source that can be configured to carry spent gasses out of the reaction chamber 12.

The apparatus 10 can also include an automated vision system 116 located in the antechamber 17 or in another location outside the chamber 12, for example, that is adapted to detect the rotational location of the reference indicia such as a dimple 110 or markings 112. The apparatus 10 can further include a robotic control system 118 arranged to rotate at least one of the wafer carrier 40 and the spindle 30. In one example, rotational location information from the automated vision system 116 and the encoder 31 can be sent to the robotic control system 118, and the robotic control system can rotate at least one of the wafer carrier 40 and the spindle 30 before or during loading of the wafer carrier into the apparatus 10, as described below.

In a particular variation, the antechamber 17 can include a keyed component (not shown) that has a known relationship with a coordinate system fixed to the reaction chamber 12. In such an example, the user or the automated vision system 116 can detect the rotational location of the reference indicia 110 or 112, and the user or the automated system can use this rotational location information to align the keyway 48 with the keyed component. Once such alignment is established, the rotational location of the keyway 48 relative to the coordinate system fixed to the reaction chamber 12 can be known before the robotic control system 118 loads the wafer carrier 40 into the chamber 12, and this rotational location can be used by the robotic control system to rotate the wafer carrier and/or the spindle 30 before loading of the wafer carrier into the reaction chamber.

In operation, at least one wafer 50 is placed on a wafer carrier 40. Next, the entry opening 16 is opened by lowering the shutter 18 to an open position. Then, a user or the automated vision system 116 can detect the rotational orientation of the wafer carrier 40, preferably in a location outside the chamber 12 such as in the antechamber 17, by detecting the location of the reference indicia (which has a known relationship to the rotational location of the keyway 48). Also, the encoder 31 can detect the rotational orientation of the spindle (which has a known relationship to the rotational location of the key 80).

The user or the robotic control system 118 can use the information about the rotational location of the reference indicia obtained by the user or the automated vision system 116, and the information about the rotational location of the spindle 30 obtained by the encoder 31, to determine whether or not the rotational locations of the key 80 and the keyway 48 are aligned when the wafer carrier 40 is being mounted onto the spindle. If the key 80 and the keyway 48 are rotationally misaligned, the user or the robotic control system 118 can rotate at least one of the wafer carrier 40 and the spindle 30 to align the rotational locations of the key and the keyway to one another prior to mounting the wafer carrier onto the spindle.

When the key 80 and the keyway 48 are rotationally aligned, the wafer carrier 40 with wafers 50 loaded thereon is loaded from the antechamber 17 into the chamber 12, and the wafer carrier 40 is releasably mounted onto the spindle 30. The wafer carrier 40 is mounted onto the spindle 30 such that the top end 70 of the shaft 36 engages into the recess 47 of the wafer carrier, and such that the key engages into the keyway, thereby placing the wafer carrier in the operative position shown in FIG. 1.

In this condition, the top surfaces of the wafers 50 face upwardly, towards the gas inlet manifold 14. The entry opening 16 is closed by raising the shutter 18 to the closed position depicted in FIG. 1. The heating element 60 is actuated, and the rotary drive 38 operates to turn the spindle 30 and hence the wafer carrier 40 around the central axis 42. Typically, the spindle 40 is rotated at a rotational speed from about 50-1500 revolutions per minute.

Process gas supply units (not shown) are actuated to supply gases through the gas inlet manifold 14. The gases pass downwardly toward the wafer carrier 40, over the top surface 41 of the wafer carrier and the top surfaces of the wafers 50, and downwardly around a periphery of the wafer carrier to the exhaust manifold 63 of the exhaust system 62. Thus, the top surface 41 of the wafer carrier 40 and the top surfaces of the wafers 50 are exposed to a process gas including a mixture of the various gases supplied by the various process gas supply units. Most typically, the process gas at the top surface 41 is predominantly composed of the carrier gas supplied by a carrier gas supply unit (not shown).

The process continues until the desired treatment of the wafers 50 has been completed. Once the process has been completed, the entry opening 16 is opened by lowering the shutter 18. Once the entry opening 16 is open, the wafer carrier 40 can be removed from the spindle 30 and can be replaced with a new wafer carrier 40 for the next operational cycle.

Figure 5:
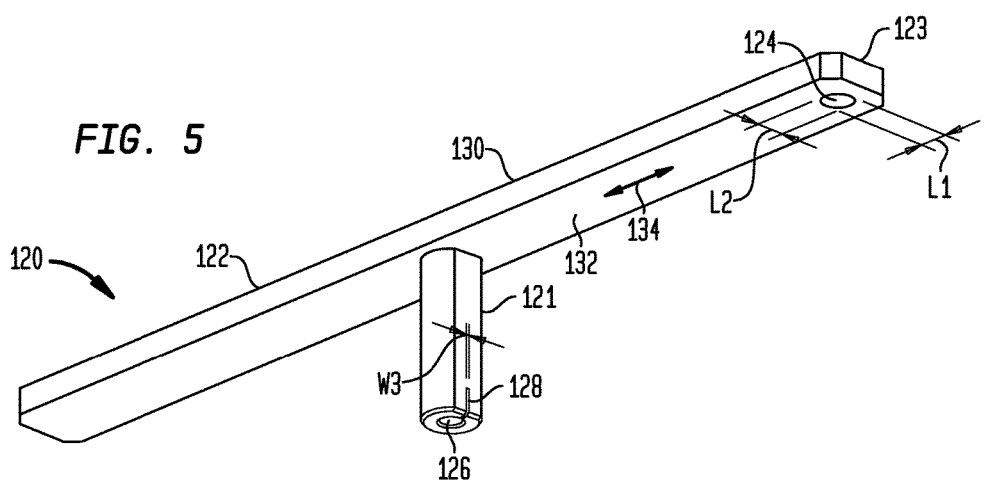
FIG. 5 is a perspective view of a homing tool suitable for aligning the orientation of the spindle shown in FIG. 1.
Figure 6A:
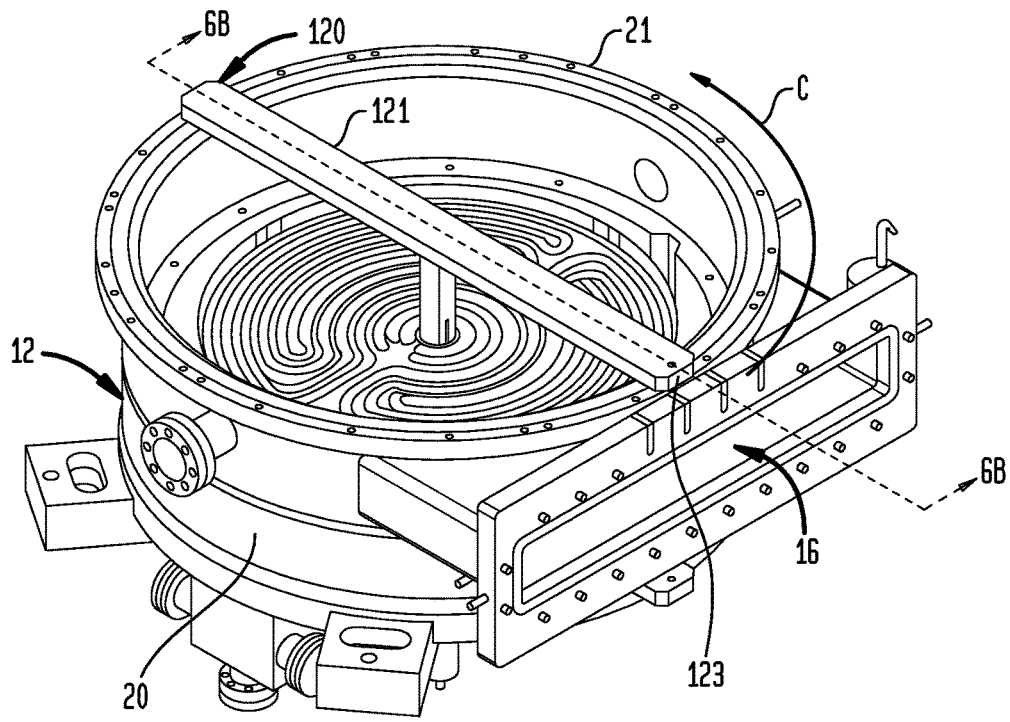
FIG. 6A is a perspective view of the homing tool shown in FIG. 5 engaged with a chemical vapor deposition apparatus in accordance with an embodiment of the invention.
Figure 6B:
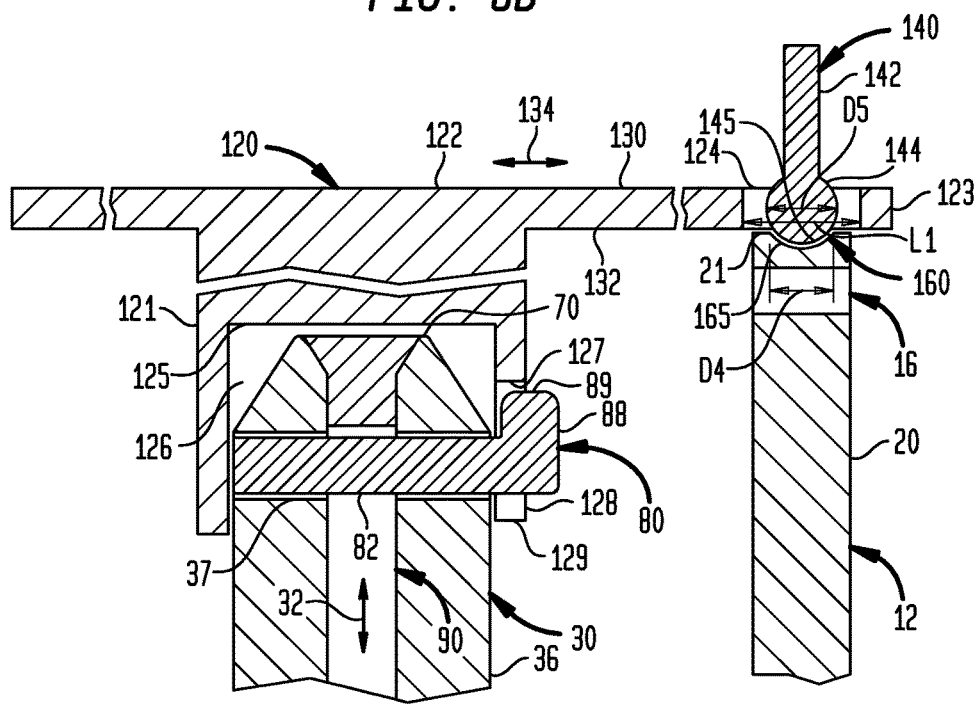
FIG. 6B is an enlarged fragmentary side cross-sectional view of a portion of the homing tool and apparatus of FIG. 6A, taken along the line 6B-6B of FIG. 6A.

Referring now to FIGS. 5, 6A, and 6B, a homing tool 120 can be used to align the angular orientation of the spindle 30 about the rotational axis 32 with respect to the reaction chamber 12, so that an encoder 31 such as that shown in FIG. 1 can provide a signal representing the rotational orientation of the spindle that has a known relationship with a coordinate system fixed to the reaction chamber.

The homing tool 120 has a socket member 121 that is configured to engage with top end 70 of the shaft 36 of the spindle 30, and a linking member 122 attached to the socket member that is configured to provide a mechanical coupling between the socket member and the cylindrical wall 20 of the reaction chamber 12.

The socket member 121 defines a socket 126 that is configured to receive the top end 70 of the shaft 36 therein. The socket member 121 also has a slot 128 extending from a bottom surface 129 of the socket member that is configured to receive the tip portion 88 of the key 80 therethrough. It is preferred that the slot 128 have a width W3 that is closely matched but slightly wider than the width W2 (FIG. 2H) of the tip portion 88 of the key 80, so that the homing tool cannot rotate more than 1.5° in either direction about the rotational axis 32 relative to the spindle 30, for a total rotational tolerance between the rotational tool and the spindle of not more than 3°.

As shown in FIG. 6A, the socket 126 and the slot 128 can be configured so that when the spindle 30 is inserted into the socket, the top end 70 of the shaft 36 can contact a top surface 125 of the socket, but the upper surface 89 of the tip portion 88 of the key 80 can be spaced apart from a top surface 127 of the slot. Having the upper surface 89 of the tip portion 88 of the key 80 spaced apart from the top surface 127 of the slot 128 can allow the weight of the homing tool 120 to be mostly borne by the shaft 36 rather than by the key. In a particular example, the socket 126 can be configured so that when the spindle 30 is inserted into the socket, the top end 70 of the shaft 36 is spaced apart from the top surface 125 of the socket. Having the top end 70 of the shaft 36 spaced apart from the top surface 125 of the socket 126 can allow the weight of the homing tool 120 to be mostly borne by the upper surface 21 of the cylindrical wall 20 rather than by the spindle 30.

The linking member 122 defines an opening 124 adjacent an end 123 thereof, the opening extending between upper and lower opposing surfaces 130, 132 of the linking member. The opening 124 preferably has a long dimension L1 extending along an axis 134 of the linking member 122 and a short dimension L2 extending substantially perpendicular to the long dimension. In a particular example, the opening 124 can have an elliptical shape, such that the long dimension L1 is a major axis of the ellipse and the short dimension L2 is a minor axis of the ellipse.

The cylindrical wall 20 of the reaction chamber 12 defines a location element in the form of a location recess 160 extending within the cylindrical wall from an upper surface 21 thereof that can be exposed when the top flange 22 (FIG. 1) of the reaction chamber is removed from the cylindrical wall. The location recess 160 has a contact surface 165 therein that has a known relationship with a coordinate system fixed to the reaction chamber. As shown in FIGS. 6A and 6B, the location recess 160 can be located above a center of the entry opening 16 of the reaction chamber 12. However, in other embodiments, the location recess 160 can be located in any known location in a coordinate system fixed to the reaction chamber 12, including, for example, a location in the base plate 24 of the reaction chamber. In a particular example, the location recess 160 can have a circular cross-sectional shape having a diameter D1, and the contact surface 165 can have a shape that is a spherical cap that is a portion of a sphere having a radius greater than or equal to the diameter of the location recess.

The opening 124 is configured to receive a locating tool 140 therethrough that is configured to couple the homing tool 120 to the location recess 160. The locating tool 140 has a handle 142 and a location portion 144 affixed to an end of the handle and defining a contact surface 145. In one embodiment, the location portion 144 can have a spherical shape having a diameter D2, and the contact surface 145 can be a spherical cap that is a portion of the sphere that defines the location portion.

In one example, the diameter D2 of the location portion 144 can be greater than the diameter D1 of the location recess 160, so that the widest part of the location portion is located within the opening 124 of the locating tool 140 when the location portion is engaged in the location recess. In an exemplary embodiment, the curvature of the contact surface 145 of the location portion 144 of the locating tool 140 can approximately match the curvature of the contact surface 165 of the location recess 160, so that there can be surface contact between the contact surfaces 145 and 165 when the locating tool is engaged with the location recess.

As shown in FIG. 6B, it is preferable that the diameter D1 of the location portion 144 of the locating tool 140 be closely matched but slightly smaller than the short dimension L2 of the opening 124 of the homing tool 120, so that when the locating tool is engaged in the location recess 160 through the opening of the homing tool, the end 123 of the homing tool is substantially fixed in a circumferential direction C relative to the locating tool and the location recess.

Furthermore, it is preferred that the Diameter D1 of the location portion 144 of the locating tool 140 be significantly smaller than the long dimension L1 of the opening 124 of the homing tool 120, so that when the locating tool is engaged in the location recess 160 through the opening of the homing tool, the end 123 of the homing tool has some freedom of motion along the axis 134 of the linking member 122 relative to the locating tool and the location recess. This freedom of motion along the axis 134 can allow a single homing tool 120 to be used for rotational alignment of the spindles of different reaction chambers 12 in a particular manufacturing facility, even if the distance between the rotational axis 32 of the spindle 30 and the location recess 160 along the axis of the linking member 122 varies between the different reaction chambers, for example, due to tolerance stack-up during assembly of the reaction chambers.

To perform a spindle homing procedure, the top flange 22 of the reaction chamber 12 can be removed from the cylindrical wall 20, thereby exposing the upper surface 21 of the cylindrical wall and the location recess 160. Next, the homing tool 120 can be aligned so that the tip portion 88 of the key 80 is facing in the same direction as the slot 128, and the homing tool can be lowered onto the spindle 30 such that the top end 70 of the shaft 36 is received into the socket 126 and the tip portion of the key is received into the slot. The homing tool 120 can be lowered onto the spindle 30 until the lower surface 132 of the linking member 122 contacts the upper surface 21 of the cylindrical wall 20.

Then, the homing tool 120 can be rotated about the rotational axis 32 of the spindle 30 until at least a portion of the location recess 160 is aligned with the opening 124 of the homing tool in the circumferential direction C. Subsequently, the location portion 144 of the locating tool 140 can be inserted into the opening 124 and into the location recess 160, such that the contact surface 145 of the location portion of the locating tool engages the contact surface 165 of the location recess, thereby fixing the rotational orientation of the spindle 30 with respect to the location recess. Finally, the encoder 31 can detect the rotational orientation of the spindle 30, and the control system 118 can assign the current rotational orientation of the spindle as a home position that has a known relationship with a coordinate system fixed to the reaction chamber 12.

In an alternate embodiment, a noncontact vision system can be used to help a user or the control system 118 to align the angular orientation of the spindle 30 about the rotational axis 32 with respect to the reaction chamber 12, so that the encoder 31 can provide a signal representing the rotational orientation of the spindle that has a known relationship with a coordinate system fixed to the reaction chamber. In such an embodiment, the spindle 30 or the key 80 can have a reference indicia, such as, for example, a highly reflective surface at a known location on the shaft 36 of the spindle. The noncontact vision system can be, for example, a laser-based detection system that has a known relationship with the coordinate system fixed to the reaction chamber 12.

In use, a user or the control system 118 can rotate the spindle 30 until the noncontact vision system detects the reference indicia of the spindle. Subsequently, the encoder 31 can detect the rotational orientation of the spindle 30, and the control system 118 can assign the current rotational orientation of the spindle as a home position that has a known relationship with a coordinate system fixed to the reaction chamber 12.

Figure 7:
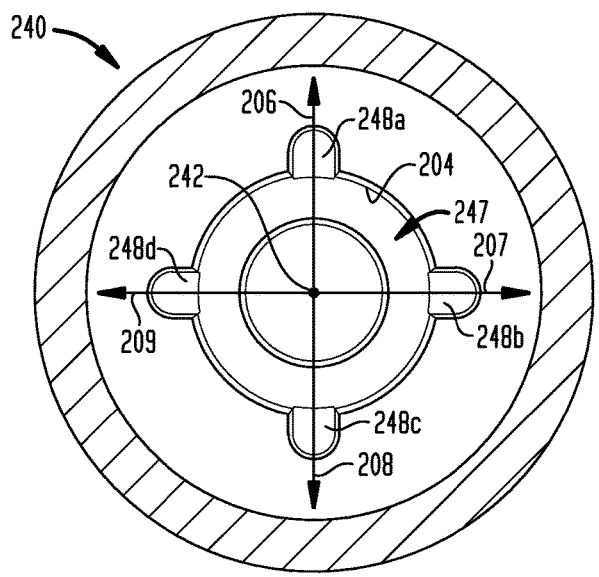
FIG. 7 is an enlarged fragmentary bottom plan view of an embodiment of a wafer carrier having a plurality of keyways, the wafer carrier being suitable for use in the chemical vapor deposition apparatus shown in FIG. 1.

FIG. 7 shows a wafer carrier 240 according to another embodiment. The wafer carrier 240 is the same as the wafer carrier 40 described above, except that the wafer carrier 240 has a plurality of keyways 248a, 248b, 248c, and 248d (collectively, the keyways 248) projecting outwardly from a periphery 204 of the recess 247 away from the rotational axis 242.

As shown in FIG. 7, there are four keyways 248, but in other embodiments, there can be two keyways, three keyways, or any other number of keyways projecting outwardly from a periphery 204 of the recess 247. It is preferred that each of the keyways 248 be disposed circumferentially about the periphery 204 of the recess 247 at regularly-spaced intervals. For example, as shown in FIG. 7, centerlines of each of the four keyways 248 are spaced at 90° intervals around the periphery 204 of the recess 247. In an example wafer carrier having three keyways, it is preferred that centerlines of each of the three keyways be spaced at 120° intervals around the periphery of the recess. In an example wafer carrier having two keyways, it is preferred that centerlines of each of the two keyways be spaced directly opposite one another (i.e., at 180° intervals) around the periphery of the recess.

In the embodiment shown in FIG. 7, each of the keyways 248a, 248b, 248c, and 248d projects outwardly from the periphery 204 of the recess 247 away from the rotational axis 242 along respective first, second, third, and fourth axes 206, 207, 208, and 209 that are each transverse to a plane containing the vertical rotational axis 242 (i.e., the first, second, third, and fourth transverse axes each intersect a plane containing the vertical rotational axis at any non-zero angle, which may be oblique or perpendicular). As shown in FIG. 7, the first, second, third, and fourth transverse axes 206, 207, 208, and 209 can intersect the vertical rotational axis 242, but that need not be the case.

In one embodiment, one or more of the keyways 248 can project outwardly from the periphery 204 of the recess 247 at an oblique angle, such that one or more of the first, second, third, and fourth transverse axes 206, 207, 208, and 209 do not intersect the vertical rotational axis 242. In the particular example shown in FIG. 7, two of the keyways 248a and 248c project outwardly from the periphery 204 of the recess 247 along a single axis, such that the first and third transverse axes 206 and 208 are coincident, and the other two keyways 248b and 248d project outwardly from the periphery of the recess along another single axis, such that the second and fourth transverse axes 207 and 209 are coincident. However, in other embodiments, each of the keyways 248 can project outwardly from the periphery 204 of the recess 247 along a transverse axis that is not coincident with any of the other transverse axes along which the other keyways project.

Figure 8B:
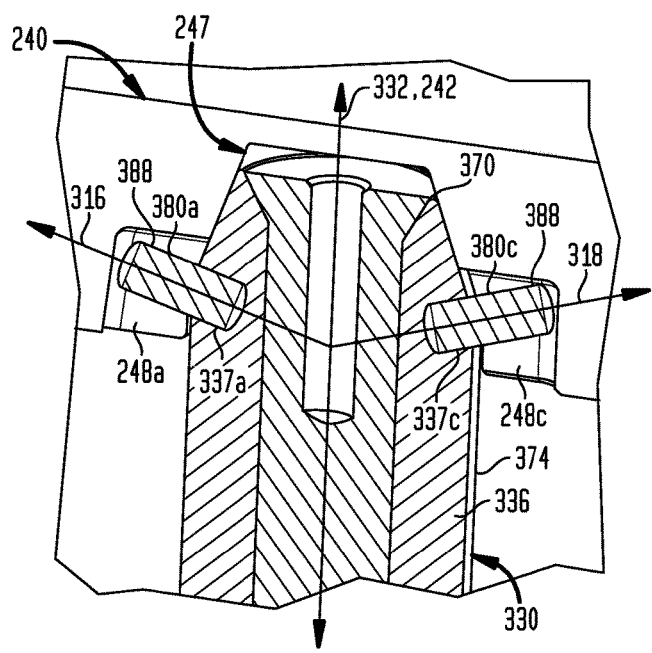
FIG. 8B is an enlarged fragmentary perspective cross-sectional view of another embodiment of a spindle having a plurality of keys, the spindle being shown engaged with the wafer carrier shown in FIG. 7.
Figure 8A:
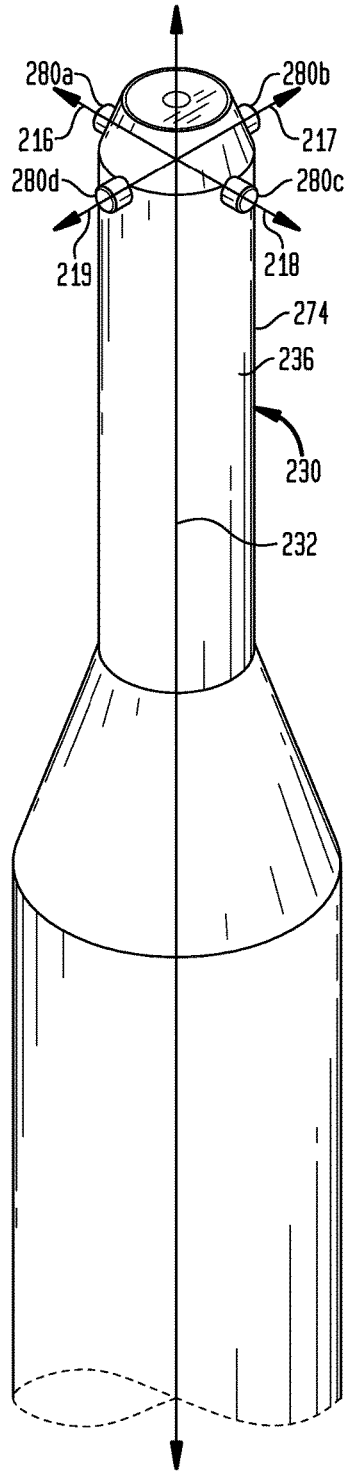
FIG. 8A is a perspective view an embodiment of a spindle having a plurality of keys, the spindle being configured for use with a wafer carrier having a plurality of keyways such as the wafer carrier shown in FIG. 7.

FIG. 8A shows a spindle 230 according to another embodiment. The spindle 230 is the same as the spindle 30 described above, except that the spindle 30 has a plurality of keys 280a, 280b, 280c, and 280d (collectively, the keys 280) projecting outwardly from a main portion 274 of the shaft 236 away from the rotational axis 232.

As shown in FIG. 8A, there are four keys 280, but in other embodiments, there can be two keys, three keys, or any other number of keys projecting outwardly from the main portion 274 of the shaft 236. It is preferred that each of the keys 280 be disposed circumferentially about the main portion 274 of the shaft 236 at regularly-spaced intervals. For example, as shown in FIG. 8A, centerlines of each of the four keys 280 are spaced at 90° intervals around the main portion 274 of the shaft 236. In an example spindle having or engaged with three keys, it is preferred that centerlines of each of the three keys be spaced at 120° intervals around the main portion of the shaft. In an example spindle having two keys, it is preferred that centerlines of each of the two keys be spaced directly opposite one another (i.e., at 180° intervals) around the main portion 274 of the shaft 236.

In the embodiment shown in FIG. 8A, each of the keys 280a, 280b, 280c, and 280d projects outwardly from the main portion 274 of the shaft 236 away from the rotational axis 232 along respective first, second, third, and fourth axes 216, 217, 218, and 219 that are each transverse to a plane containing the vertical rotational axis 232 (i.e., the first, second, third, and fourth transverse axes each intersect a plane containing the vertical rotational axis at any non-zero angle, which may be oblique or perpendicular). As shown in FIG. 8A, the first, second, third, and fourth transverse axes 216, 217, 218, and 219 can intersect the vertical rotational axis 232, but that need not be the case.

In one embodiment, one or more of the keys 280 can project outwardly from the main portion 274 of the shaft 236 at an oblique angle, such that one or more of the first, second, third, and fourth transverse axes 216, 217, 218, and 219 do not intersect the vertical rotational axis 232. In the particular example shown in FIG. 8A, two of the keys 280a and 280c project outwardly from the main portion 274 of the shaft 236 along a single axis, such that the first and third transverse axes 216 and 218 are coincident, and the other two keys 280b and 280d project outwardly from the periphery of the recess along another single axis, such that the second and fourth transverse axes 217 and 219 are coincident. However, in other embodiments, each of the keys 280 can project outwardly from the main portion 274 of the shaft 236 along a transverse axis that is not coincident with any of the other transverse axes along which the other keys project.

A spindle having a plurality of keys extending from the main portion of the shaft can be configured in a variety of ways. For example, the configuration of the spindle 230 having four keys 280 extending from the main portion of the shaft can be fabricated as a single unitary casting. In other embodiments, spindles having any other number of keys, such as one, two, or three keys, can be fabricated as a single unitary casting. In another example, a spindle having two key portions extending from the main portion of the shaft can be similar to the configuration shown in FIGS. 4 and 6B, except that each key portion can be an end portion of a single key extending through an aperture of the shaft, and each of the end portions can be received in a corresponding keyway of a wafer carrier when a wafer carrier is assembled with the spindle.

FIG. 8B shows a cross section of a spindle 330 that is an alternate embodiment of the spindle 230 shown in FIG. 8A. The spindle 330 is the same as the spindle 230 described above, except that the spindle 330 has a plurality of keys 380a and 380c (collectively, the keys 380) projecting outwardly from a main portion 374 of the shaft 336 away from the rotational axis 332 that are formed separately and assembled with the spindle. In spindle embodiments having four keys, the other two keys 380 are not visible in the cross section shown in FIG. 8B. In the embodiment shown in FIG. 8B, each of the keys 380a and 380c is engaged in a corresponding aperture 337a and 337c extending partially into the main portion 374 of the shaft 336. Each aperture 337a and 337c projects along a corresponding first and third transverse axis 316 or 318.

Each of the keys 380a and 380c projects outwardly from the main portion 374 of the shaft 336 away from the rotational axis 332 along respective the first and third axes 316 and 318 that each intersect a plane containing the rotational axis at an oblique angle. In the embodiment shown in FIG. 8B, the first and third transverse axes 316 and 318 each intersect a plane containing the rotational axis 332 at an angle of approximately 75°. It is preferred that the first and third transverse axes 316 and 318 each intersect a plane containing the rotational axis 332 at an angle between about 45° and about 85°. Each of the keys 380a and 380c can have a width that is equal to or slightly less than a width of the corresponding aperture 337a or 337c, such that each of the keys can be press-fit into the corresponding aperture.

As can be seen for example in FIG. 8B, either of the spindles 230 or 330 having a plurality of keys 280 or 380 can be engaged with a wafer carrier such as the wafer carrier 240 having a plurality of keyways 248. The engagement of a spindle having a plurality of keys with a wafer carrier having a plurality of keyways can be similar to the engagement of the spindle 30 and the wafer carrier 40 described above with reference to FIG. 4. For example, as shown in FIG. 8B, the top end 370 of the spindle 330 can be engaged in the recess 247 of the wafer carrier 240, and a tip portion 388 of each of the keys 380a and 380c can be engaged in a respective keyway 248a and 248c.

It is preferred that a spindle having a plurality of keys be engaged with a wafer carrier having an equal number of keyways, but that need not be the case. In one example, a spindle having any number of keys can be engaged with a wafer carrier having any number of keyways that is equal to or greater than the number of keys, such that each keyway can be occupied by a key, or one or more keyways can be remain empty (i.e., devoid of a key). For example, a spindle having two keys can be engaged with a wafer carrier having two, three, or four, or any other number of keyways.

Although FIGS. 8A and 8B show keys 280 and 380 having tip portions with circular cross-sections, such spindles 230 and 330 having a plurality of keys can have keys with tip portions having a variety of cross-sectional shapes. For example, the spindles 230 and 330 can have one or more keys having a tip portion with a non-circular cross-section such as the tip portion 88 of the key 80 shown in FIGS. 2F-2H.

In a particular embodiment, a spindle such as the spindle 230 and 330 can have one or more keys each having a tip portion with a first cross-section, and one or more keys each having a tip portion with a second cross-section that is a different shape than the first cross-section. For example, a spindle having two keys can have one key having a tip portion with a circular cross-section such as one of the keys 280 or 380, and another key having a tip portion with a non-circular cross-section such as the key 80.

The keyed wafer carrier systems and methods according to the invention, as described above, can have several potential advantages compared to conventional rotating disc reactor systems and methods.

In conventional MOCVD reactors, the wafer carrier can be disposed at a random rotational position relative to the spindle. This can make it more difficult for a user to know the exact rotational location of the wafers held on the wafer carrier. This uncertainty of wafer position may negatively impact the ability to monitor the treatment process. Moreover, the torque that can be transmitted through the engaged surfaces of the spindle and carrier is limited by the force of frictional engagement between the surfaces. In an emergency, it may be necessary to decelerate the rotation of the spindle and the wafer carrier rapidly. This requires transmission of a large torque to the carrier.

In contrast, an apparatus 10 as described above having a key 80 of the spindle 30 engaged in a keyway 48 of the wafer carrier 40 can result in improved certainty of the exact rotational location of the wafers 50 held on the wafer carrier. A robotic control system 118 can identify particular wafers 50 during operation of the apparatus using a signal from the encoder 31, and a user or an automated vision system 116 can identify particular wafers after operation of the apparatus using the reference indicia 110 or 112, even when the pockets 43 are symmetrically distributed about the vertical rotational axis 42. Wafer identification information can be used to correlate in-situ monitoring data (e.g., reflectivity and temperature signals) with particular wafers on the wafer carrier 40 during and after wafer processing (e.g., for binning LEDs after growth), which can result in a more uniform wafer treatment process, for example, due to more optimal temperature control during wafer processing.

In many MOCVD growth processes, it can be necessary to differentiate between carrier and wafer temperature signals measured by the operating pyrometers 70. This can be done using differences in reflectivity or emission signals received by the operating pyrometers 70 from the wafers 50 and the wafer carrier 40. Determination of the angular orientation of the wafer carrier 40, as enabled by the apparatus 10 described above having a key 80 engaged in a keyway 48, can be helpful in particular wafer growth processes where the operating pyrometers 70 cannot distinguish a difference in either reflectivity or emission signals received from the wafers 50 and the wafer carrier 40. Because the exact positions of the pockets 43 are known relative to the keyway 48, and the rotational orientation of the keyway 48 can be detected by the encoder 31, obtaining the angular orientation of the wafer carrier 40 from the encoder can be sufficient for a control system such as the control system 118 to determine if the operating pyrometers 70 are receiving radiation from a location on a wafer or a location on the wafer carrier.

Also, the apparatus 10 can permit transmission of a higher torque through the engaged surfaces 73, 102 of the spindle 30 and the wafer carrier 40 that is not limited by the force of frictional engagement between the surfaces, such as during high acceleration of the wafer carrier in normal operation of the apparatus, or during an emergency off shutdown of the rotary drive mechanism 38. In a conventional MOCVD reactor, if the torque resulting from high acceleration of the wafer carrier or from an emergency off shutdown is high enough, the wafer carrier can rotationally slip relative to the spindle, which can result in wobbling of the wafer carrier (i.e., tilt of the wafer carrier 40 such that the first transverse axis 106 of the wafer carrier is not perpendicular to the rotational axis 32 of the spindle 30) that can damage the carrier-spindle interface and other components of the reactor near the carrier. In an apparatus 10 according to the invention, the engagement of the key 80 in the keyway 48 can prevent rotational slip of the wafer carrier 40 relative to the spindle 30 during high acceleration of the wafer carrier or during an emergency off shutdown, thereby permitting the apparatus 10 to operate using a larger wafer carrier (having a greater moment of inertia) than can be used in a conventional MOCVD reactor with the same risk of spindle-carrier slip.

Furthermore, in an embodiment of the apparatus 10 where there is a close fit between the width W2 of the end portions 86 of the shank 82 of the key 80 and the diameter D1 of the aperture 37 in the shaft 36, torsional loads between the wafer carrier 40 and the spindle 30 can be borne primarily by the key and the shaft, rather than by the fork 90, which is constrained from rotational motion only by the key, not by the shaft. Therefore, the fork 90 does not have to bear significant torsional loads, and it can be protected from damage by the key 80.

If the key 80 becomes bent or broken during an emergency off shutdown of the spindle 30 as a result of such torsional loads, for example, the fork 90 can be withdrawn from the recess 39, a new key can be inserted into the aperture 37, and the fork can be replaced into the recess 39, without having to remove or replace the shaft 36.

The invention can be applied in various wafer treatment processes using a rotating disc reactor as, for example, chemical vapor deposition, chemical etching of wafers, and the like. Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims. It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A wafer carrier comprising:
a body defining oppositely-facing top and bottom surfaces, a peripheral surface extending between the top and bottom surfaces, and a vertical rotational axis substantially perpendicular to the top and bottom surfaces, the body having reference indicia defined in at least one of the top surface, the bottom surface, or the peripheral surface, the reference indicia being visible to an imaging device;
a plurality of pockets defined in the top surface of the body, each pocket configured so that a wafer is holdable therein with a surface of the wafer exposed at the top surface of the body, each said pocket having a center;
a recess extending into the body from the bottom surface of the body, the recess defining a periphery; and
a keyway projecting outwardly from the periphery of the recess away from the rotational axis along a first transverse axis, the reference indicia being disposed at a predetermined location relative to the keyway in a circumferential direction around the vertical rotational axis,
wherein at least some of the pockets are disposed adjacent the rotational axis and arranged in a circular pattern distributed around the rotational axis with spaces between centers of adjacent pockets in the pattern, and wherein the keyway is aligned with one said space such that the first transverse axis bisects the one said space.

2. The wafer carrier as claimed in claim 1, wherein the at least some of the pockets that are arranged in the circular pattern are distributed symmetrically around the vertical rotational axis.

3. The wafer carrier as claimed in claim 1, wherein a plane parallel to the bottom surface of the wafer carrier and containing the first transverse axis extends through the reference indicia.

4. The wafer carrier as claimed in claim 1, wherein the wafer carrier is substantially disc-shaped.

5. A structure for a chemical vapor deposition reactor, the structure comprising the wafer carrier as claimed in claim 1, the structure further comprising:
a reaction chamber having an interior; and
a spindle mounted in the reaction chamber, the spindle having a shaft extending along the vertical rotational axis and a key projecting outwardly from the shaft along the first transverse axis, wherein the wafer carrier is releasably mounted onto the spindle for rotation therewith about the vertical rotational axis, the shaft being engaged in the recess and the key being engaged into the keyway.

6. The structure as claimed in claim 5, wherein the key has a tip portion engaged into the keyway, the tip portion having an upper surface confronting and spaced apart from a downward-facing surface of the body exposed within the keyway so that the key does not constrain the body against downward movement relative to the shaft.

7. The structure as claimed in claim 5, wherein the shaft has a top end and a tapered contact surface having progressively increasing diameter in the downward direction away from the top end.

8. The structure as claimed in claim 7, wherein the shaft has a main portion below the tapered contact surface and the key is engaged with the main portion of the shaft.

9. The structure as claimed in claim 7, wherein the body has a downward-facing recess end surface and a tapered contact surface within the recess extending downwardly from the recess end surface, the tapered contact surface of the body being at least partially in contact with the tapered contact surface of the shaft, and wherein the end surface is spaced apart from the top end of the spindle.

10. The structure as claimed in claim 9, wherein a centroid of the surface contact between the tapered contact surfaces of the body and the shaft is located above the center of gravity of the body.

11. The structure as claimed in claim 5, wherein the spindle has an aperture extending through the shaft along the first transverse axis and the key includes a shank engaged in the aperture.

12. The structure as claimed in claim 11, wherein the spindle further defines a recess extending from the top end of the shaft along the vertical rotational axis, wherein the spindle further includes a fork removably engaged in the recess, the fork having a pair of tines, the shank of the key being engaged between the tines of the fork.

13. The structure as claimed in claim 12, wherein the shank of the key has a central portion located between the two tines of the fork and end portions adjacent the central portion, the central portion having a width that is less than a separation distance between the tines of the fork, each end portion having a width that is greater than the separation distance, such that the key is interlocked between the two tines and retained by the fork against movement relative to the shaft along the first transverse axis.

14. The structure as claimed in claim 13, wherein the central portion of the key includes oppositely-facing substantially planar side surfaces, each side surface disposed adjacent a surface of one of the tines, such that the key is rotationally fixed by the fork against rotation about the first transverse axis.

15. The structure as claimed in claim 12, wherein the key and the fork each consist essentially of a first material, and wherein the shaft consists essentially of a second material different than the first material.

16. The structure as claimed in claim 12, wherein the fork includes a threaded aperture and the threaded aperture is exposed at the top end of the shaft.

17. The structure as claimed in claim 11, wherein the key has a tip portion disposed outside of the shaft, the tip portion having a height in a longitudinal direction parallel to the vertical rotational axis that is greater than a diameter of the aperture.

18. The structure as claimed in claim 17, wherein the tip portion of the key has a rounded upper surface that faces toward the top end of the shaft.

19. The structure as claimed in claim 5, wherein the at least some of the pockets that are arranged in the circular pattern are distributed symmetrically around the vertical rotational axis.

20. The structure as claimed in claim 5, wherein a plane parallel to the bottom surface of the wafer carrier and containing the first transverse axis extends through the reference indicia.

21. The structure as claimed in claim 5, further comprising an encoder connected to the spindle and arranged to provide a signal representing the rotational orientation of the spindle, an automated vision system adapted to detect the rotational location of the reference indicia, and a robotic control system arranged to rotate at least one of the wafer carrier and the spindle to align the rotational locations of the key and the keyway to one another.

22. The structure as claimed in claim 5, wherein the wafer carrier is substantially disc-shaped.

23. The wafer carrier as claimed in claim 1, wherein the body has a downward-facing recess end surface and a tapered contact surface within the recess extending downwardly from the recess end surface.

24. The structure as claimed in claim 5, further comprising a control system configured to determine the rotational location of the keyway relative to the rotational axis from the observation of the rotational orientation of the reference indicia relative to the rotational axis.

25. The wafer carrier as claimed in claim 1, wherein the body of the wafer carrier defines a downward-facing surface exposed within the keyway and opposing lateral surfaces exposed within the keyway that extend from the bottom surface of the body to the downward-facing surface, and the first transverse axis is located equidistant from the opposing lateral surfaces of the keyway.

* * * * *